United States Patent
Zhu

[19]

[11] Patent Number: 6,103,015
[45] Date of Patent: Aug. 15, 2000

[54] SYMMETRICAL CVD COATER WITH LOWER UPSTREAM EXHAUST TOE

[75] Inventor: Min Zhu, Kent, Wash.

[73] Assignee: Libbey-Owens-Ford Co., Toledo, Ohio

[21] Appl. No.: 09/222,220

[22] Filed: Dec. 29, 1998

Related U.S. Application Data

[60] Provisional application No. 60/071,781, Jan. 19, 1998.

[51] Int. Cl.$^7$ .................................................. C23C 16/00
[52] U.S. Cl. ............................................................ 118/718
[58] Field of Search .................................... 118/718, 715

[56] References Cited

U.S. PATENT DOCUMENTS

| | | | |
|---|---|---|---|
| 3,888,649 | 6/1975 | Simhan ........................................ | 65/60 |
| 4,446,815 | 5/1984 | Kalbskopf et al. ...................... | 118/718 |
| 4,504,526 | 3/1985 | Hofer et al. . | |
| 4,584,206 | 4/1986 | Sleighter . | |
| 4,928,627 | 5/1990 | Lindner . | |
| 4,933,211 | 6/1990 | Sauvinet et al. . | |
| 5,089,039 | 2/1992 | Terneu et al. . | |
| 5,122,394 | 6/1992 | Linder .................................... | 427/255.5 |
| 5,487,784 | 1/1996 | Ellis, Jr. . | |
| 5,863,337 | 1/1999 | Neuman et al. ......................... | 118/718 |

FOREIGN PATENT DOCUMENTS

| | | |
|---|---|---|
| 0 309 902 | 4/1989 | Germany . |
| 0 499 523 | 8/1992 | Germany . |
| 0 499 524 | 8/1992 | Germany . |
| 0 611 733 | 8/1994 | Germany . |
| 2 044 137 | 2/1979 | United Kingdom . |
| 2 068 935 | 1/1980 | United Kingdom . |
| 2 274 116 | 1/1993 | United Kingdom . |

*Primary Examiner*—Richard Bueker
*Assistant Examiner*—Erin Fieler
*Attorney, Agent, or Firm*—Marshall & Melhorn

[57] ABSTRACT

An apparatus and method for coating a surface of a sheet of glass by deposition of a coating material on the surface as the sheet is conveyed past the apparatus. The apparatus consists of a supply line for supplying a gaseous precursor mixture. The precursor mixture is applied to the surface of a sheet of glass through a chamber. The chamber includes an inlet connected to the supply line and an outlet adjacent the sheet of glass.

The apparatus also includes an upstream exhaust tower including a passageway for exhausting unreacted portions of the gaseous precursor mixture and an upstream exhaust toe positioned a specific height above the glass surface.

Lastly, the apparatus includes a downstream exhaust tower including a passageway for exhausting unreacted portions of the gaseous precursor mixture and a downstream exhaust toe positioned a specific height above the glass surface which is greater than the height at which said upstream exhaust toe is positioned. The distance between the outlet of said chamber and the passageway in said upstream exhaust tower is approximately equal to the distance between the outlet of said chamber and the passageway in said downstream exhaust tower.

11 Claims, 2 Drawing Sheets

SYMMETRICAL CVD COATER WITH LOWER UPSTREAM EXHAUST TOE

RELATED APPLICATIONS

This application is claiming the benefit, under 35 U.S.C. § 119(e), of the provisional application filed Jan. 19, 1998 under 35 U.S.C. § 111(b), which was granted a serial number of 60/071,781. The provisional application, Ser. No. 60/071,781, is hereby incorporated by reference.

BACKGROUND OF THE INVENTION

This invention relates generally to the chemical vapor deposition of coatings onto glass substrates, and more particularly, to an apparatus for the application, by chemical vapor deposition (CVD), of a coating onto glass, especially during its manufacture by the float glass process.

Chemical vapor deposition processes are often used to continuously coat glass substrates while the glass is being manufactured in what is generally known in the art as the float glass process. The float glass process typically involves casting glass onto a molten tin bath which is suitably enclosed, then transferring the glass, after it has sufficiently cooled, to lift-out rolls which are aligned with the bath, and finally cooling the glass as it advances across the rolls through a lehr. The chemical vapor deposition of various coatings may conveniently be performed in the bath, the lehr, or the transition zone therebetween.

Chemical vapor deposition generally involves the formation of a metal, metal compound, or metal oxide coating, or combination thereof, on a surface of a hot glass substrate, by contacting the surface with a gaseous mixture or precursor containing a vaporized substance which undergoes a chemical reaction or decomposition. Such coatings are generally applied to modify the apparent color or solar characteristics of the glass or to impart electrical conductance to the surface of the glass.

The coating or precursor gas is directed onto a surface to be coated by a coater or distributor beam extending across the upper surface of a moving ribbon of glass and transverse to the direction of movement of the ribbon. This device is especially useful for applying a coating from a gas which reacts on contacting the hot glass surface to deposit a coating material on the glass, such as for example a metal vapor. The temperature of the gas supply and the coater is preferably kept sufficiently high to prevent condensation of the coating gas, but sufficiently low to prevent any substantial decomposition or other deleterious reactions of the coating gas before the coating gas reaches the glass surface.

One type of conventional CVD coater may be termed a uniflow coater. In this type of coater, the coating gas is supplied through an elongate passageway from a supply line to an outlet adapted to be positioned adjacent a surface of the glass. The coating gas is directed to the glass surface where it reacts to form the coating. The unreacted portions of the coating gas flow in the direction of glass travel, i.e. downstream, and are drawn away from the glass surface through an exhaust passageway to which is applied a negative pressure.

Generally, the front and back edges of a conventional CVD coater are each superposed over the top surface of the advancing glass ribbon, thereby defining narrow gaps through which gases exterior from the coater may be drawn so as not to contaminate the controlled atmosphere within the float glass facility. However, with a uniflow coater, the upstream edge or toe of the coater must be positioned very near the glass surface to prevent the excessive flow of atmospheric gases into the coating zone, resulting in coating non-uniformity and lower deposition rates.

In response at least in part to these difficulties, dual flow CVD coaters have been developed in which upstream and downstream exhaust passageways are provided on either side of the coating gas supply passageway. Thus, the coating gas is directed through the supply passageway to the glass surface where it reacts to form the coating, and unreacted portions of the coating gas flow both with and against the direction of glass travel, i.e. downstream and upstream, being drawn away from the glass surface through the respective exhaust passageways. Exterior gas which flows under the upstream toe of the coater is drawn up the upstream exhaust passageway along with the upstream flow of unreacted coating gas, so that the upstream toe may be positioned farther from the glass surface.

To enhance the uniformity of the deposited coating, it is generally desired that the flow rate in the upstream reaction zone is balanced with that through the downstream reactions zone. However, the viscous drag caused by the flow of the glass ribbon tends to increase the flow rate in the downstream reaction zone relative to the flow rate in the upstream reaction zone.

One approach utilized in conventional dual flow CVD coaters to compensate for the viscous drag of the glass is to apply a significantly higher negative pressure to the upstream exhaust passageway, thereby increasing the upstream exhaust flow rate. However, depending upon the application and the desired flow rates, the negative pressures required to balance the flow rates in the reaction zones may be difficult to maintain. In addition, such a relatively high flow rate in the upstream exhaust passageway may cause recirculation of the gas, possibly resulting in powder build-up on the coater and haze in the coated glass product.

Another approach which has been utilized in dual flow CVD coaters is to construct the coater asymmetrically, so that there is a significantly greater distance between the supply passageway and the downstream exhaust passageway than between the supply passageway and the upstream exhaust passageway. However, an asymmetrical coater is undesirable from the standpoint of construction flexibility, in that such a coater can be inserted from one side, but not the opposite side, of a float glass manufacturing line due to the supply and control devices which are typically secured to one end of the coater.

SUMMARY OF THE INVENTION

The present invention is an apparatus for coating a surface of a sheet of glass by deposition of a coating material on the surface as the sheet is conveyed past the apparatus. A precursor mixture including the coating material is supplied to the apparatus. The mixture enters a chamber of the apparatus disposed such that the mixture is dispensed adjacent the surface of the sheet of glass to be coated.

The coating apparatus of the invention includes an upstream exhaust tower and a downstream exhaust tower. Each exhaust tower includes a passageway for exhausting unreacted portions of the precursor mixture and an exhaust toe.

The upstream exhaust tower has an exhaust toe which is positioned a specific height above the glass surface. The downstream exhaust toe is positioned a specific height above the glass surface which is greater than the height at which the upstream exhaust toe is positioned.

The distance from the passageway of the upstream exhaust tower to the chamber is approximately equal distance to the distance between the downstream exhaust tower and the chamber. As a result of this, the coater, of the present invention, may be positioned across the glass ribbon substantially symmetrical and from either side.

In a preferred embodiment, a shim is disposed between the upstream exhaust tower and the upstream exhaust toe to position the upstream exhaust toe closer to the sheet of glass than the downstream exhaust toe.

An advantage of the present invention is that the upstream exhaust tower and the downstream exhaust tower can operate at substantially equal flowrates.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

One or more coaters in accordance with the invention can be utilized, for example, in a CVD process in which a uniform coating is applied to the upper surface of a ribbon of float glass. The position of the coater or coaters with respect to the inlet and outlet ends of a bath upon which the ribbon floats depends upon the optimum temperature of the glass in relation to the material being deposited. The coater can also be utilized in the lehr if the temperatures and the ambient atmosphere are suitable for the particular coating chemistry. In fact, the coater of the invention could be utilized apart from the float glass process as long as the substrate was otherwise maintained at a temperature and within an atmosphere suitable for the particular coating chemistry.

Figure 1:
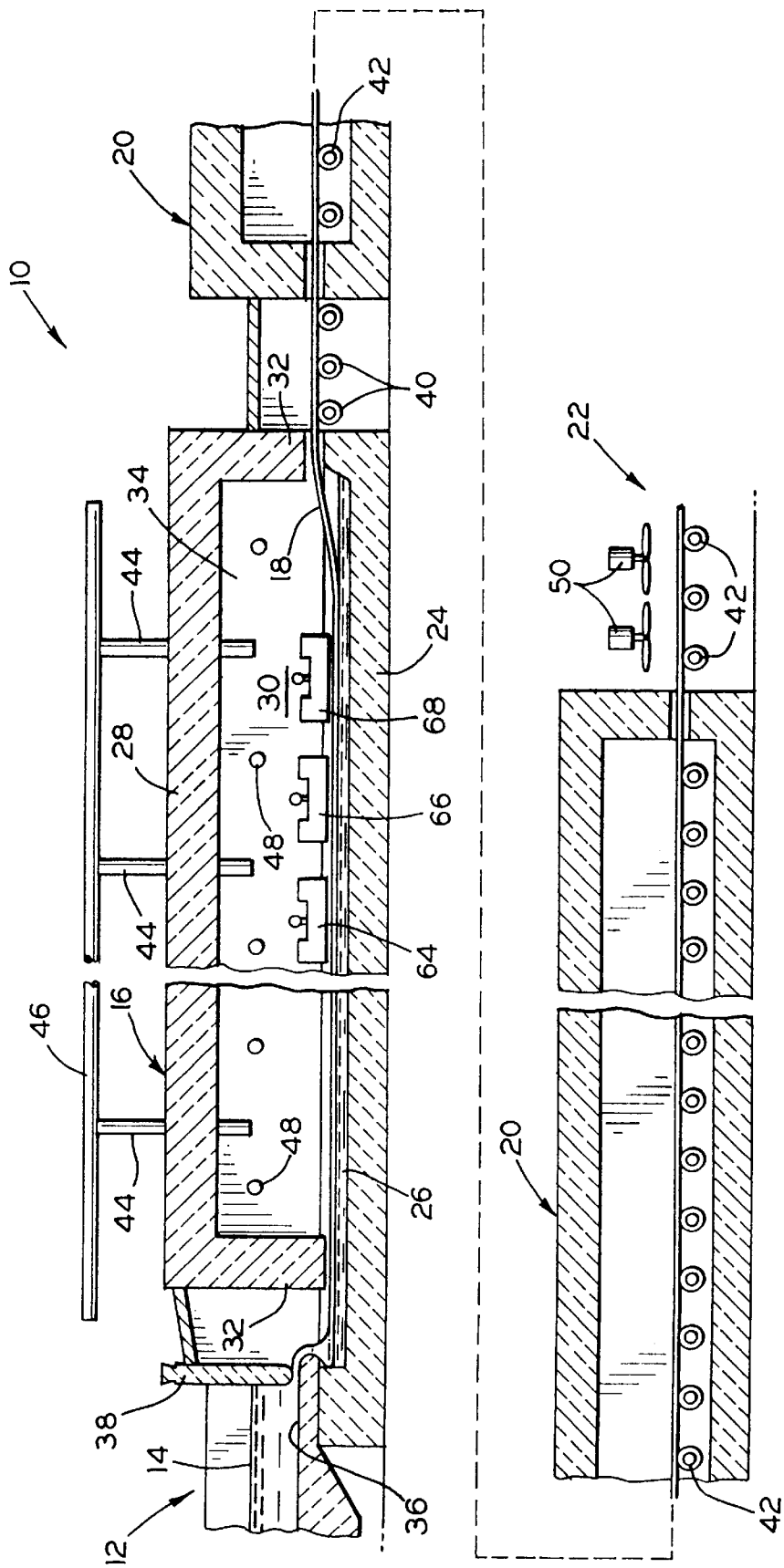
FIG. 1 is a side elevational view of a float glass manufacturing apparatus shown in cross-section and including a coater in accordance with the present invention.

Referring now more particularly to the drawings, there is illustrated generally at 10 in FIG. 1 a float glass installation with which the coaters of the invention may be utilized. The float glass installation 10 more particularly comprises a canal section 12 along which molten glass 14 is delivered from a melting furnace (not shown), to a float bath section 16 wherein a continuous glass ribbon 18 is formed in accordance with the well known float process. The glass ribbon 18 advances from the bath section 16 through an adjacent annealing lehr 20 and a cooling section 22. The continuous glass ribbon 18 serves as the substrate upon which a coating may be deposited utilizing the coater and coating method of the invention.

The float section 16 includes a bottom section 24 within which a bath of molten tin 26 is contained, a roof 28, opposite sidewalls 30, and end walls 32. The roof 28, side walls 30, and end walls 32 together define an enclosure 34 in which a non-oxidizing atmosphere is maintained to prevent oxidation of the molten tin. Additionally, as illustrated in FIG. 1, three CVD coaters 64, 66 and 68 in accordance with the invention are located in the bath section 16.

In operation, the molten glass 14 flows along the canal 36 beneath a regulating tweel 38 and downwardly onto the surface of the tin bath 26 in controlled amounts. On the tin bath, the molten glass spreads laterally under the influences of gravity and surface tension, as well as certain mechanical influences, and it is advanced across the bath to form the ribbon 18. The ribbon is removed over lift out rolls 40 and is thereafter conveyed through the annealing lehr 20 and the cooling section 22 on aligned rolls 42.

A suitable non-oxidizing atmosphere, generally nitrogen or a mixture of nitrogen and hydrogen in which nitrogen predominates, is maintained in the bath enclosure 34 to prevent oxidation of the tin bath. The atmosphere gas is typically admitted through conduits 44 operably coupled to a distribution manifold 46. The non-oxidizing gas is introduced at a rate sufficient to compensate for normal losses and maintain a slight positive pressure, on the order of about 0.001 to about 0.01 atmosphere above ambient atmospheric pressure, so as to prevent infiltration of outside atmosphere. Heat for maintaining the desired temperature regimen in the tin bath 26 and the enclosure 34 may be provided by radiant heaters 48 within the enclosure.

The atmosphere within the lehr 20 is typically atmospheric air, while the cooling section 22 is not enclosed and the glass ribbon is open to the ambient atmosphere. Ambient air may be directed against the glass ribbon as by fans 50 in the cooling section. Heaters (not shown) may also be provided within the annealing lehr for causing the temperature of the glass ribbon to be gradually reduced in accordance with a predetermined regimen as it is conveyed therethrough.

Figure 2:
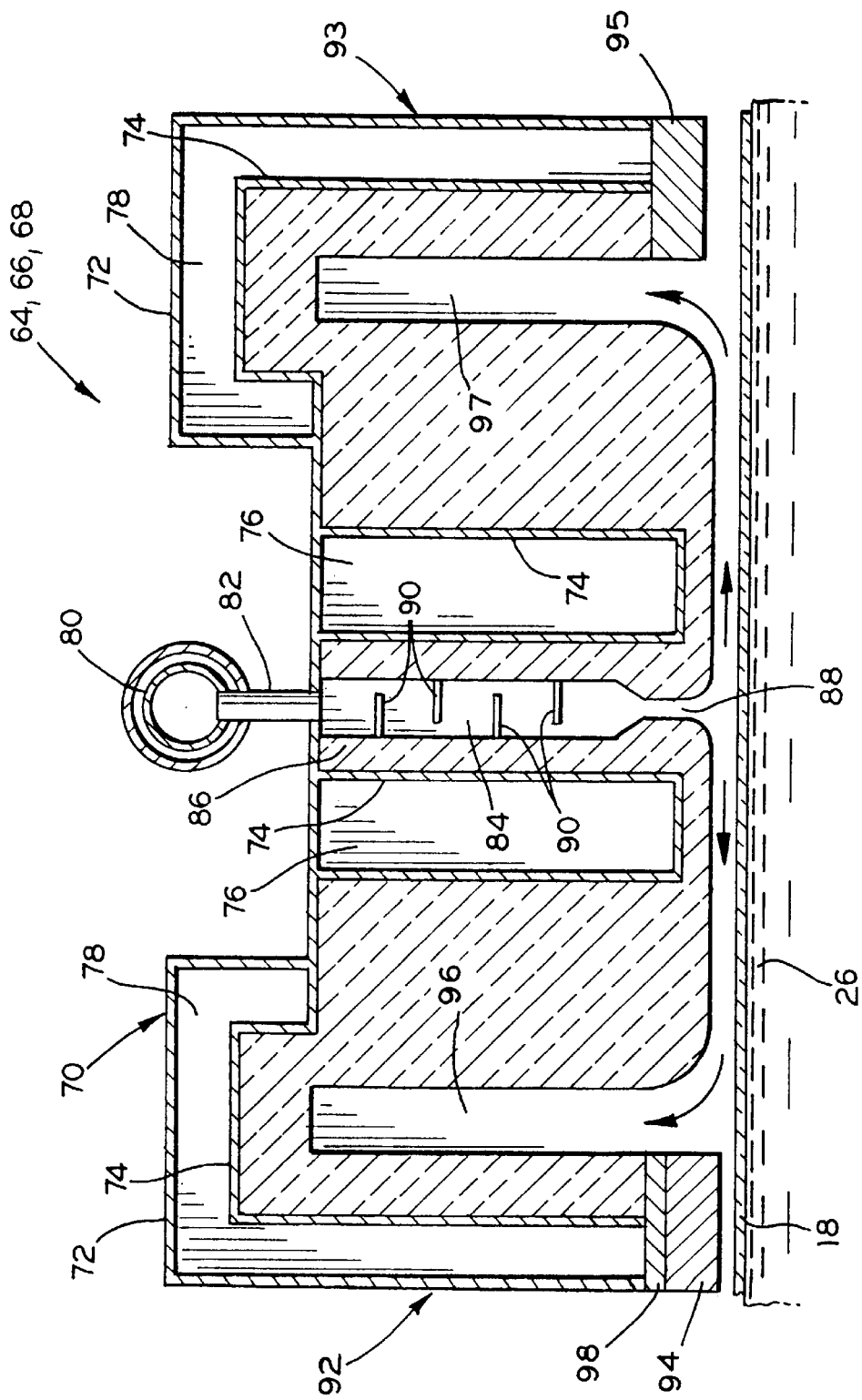
FIG. 2 is an enlarged side elevational cross-sectional view of the coater shown in FIG. 1.

The configuration of the coaters of the invention is shown, somewhat schematically, in FIG. 2. An inverted generally channel-shaped framework 70 formed by spaced inner and outer walls 72 and 74 defines enclosed cavities 76 and 78. A suitable heat exchange medium is circulated through the enclosed cavities 76, 78 in order to maintain the coaters at a desired temperature.

The precursor gas mixture is supplied through a fluid cooled supply conduit 80. The supply conduit 80 extends along the length of the coater and admits the precursor gases through drop lines 82 spaced along the supply conduit. The supply conduit 80 leads to a delivery chamber 84 within a header 86 carried by the framework. Precursor gases admitted through the drop lines 82 are discharged from the delivery chamber 84 through a passageway 88 toward and along the surface of the glass 18 in the direction of the arrows in FIG. 2. Baffle plates 90 may be provided within the delivery chamber 84 for equalizing the flow of precursor materials across the coater to assure that the materials are discharged against the glass 18 in a smooth, laminar, uniform flow entirely across the coater.

The framework also supports a pair of exhaust towers which, with the glass 18 flowing from left to right as illustrated in FIG. 2, may be defined as an upstream exhaust tower 92 and a downstream exhaust tower 93. Each of the exhaust towers extends downwardly toward the glass 18, terminating in respective exhaust toes, 94 and 95, which are secured to the associated exhaust tower by suitable means, such as by bolt assemblies (not shown). Spent precursor materials are collected and removed through upstream and downstream exhaust passageways 96 and 97 defined in the respective exhaust towers 92 and 93. Gases from the exterior of the coater are drawn through the gaps between the exhaust toes 94 and 95 and the glass 18 so as not to contaminate the controlled atmosphere within the float glass facility with the precursor gases.

The coater is substantially symmetrical, with the distance between the passageway 88 and the upstream exhaust passageway 96 being approximately equal to the distance between the passageway 88 and the downstream exhaust passageway 97. In addition, in accordance with the invention, the upstream exhaust toe 94 extends closer to the upper surface of the glass 18 than does the downstream exhaust toe 95. In a preferred embodiment, this is accomplished by providing a shim 98 interposed between the upstream exhaust tower 92 and exhaust toe 94 and extending the length of the coater. In this case, shims of varying thickness may be employed depending upon the line speed and precursor flow rates. The reduced gap between the glass 18 and the upstream exhaust toe 94 causes in an increased resistance to flow therebetween, thereby compensating, at least in part, for the downstream flow induced by the viscous drag of the moving glass 18. As a result, the coater in accordance with the invention may be positioned across the glass ribbon 18 from either side of the installation without requiring significantly uneven exhaust flow rates to achieve a substantially even precursor flow split.

The following predictive examples are presented solely for the purpose of further illustrating and disclosing the present invention, and are not to be construed as a limitation on the invention.

COMPARATIVE EXAMPLE

The relationship between the exhaust and precursor flows needed to balance flow in the reactions zones was calculated for a symmetrical dual flow CVD coater wherein the upstream and downstream toes were both positioned ¼ inch above the glass surface. At a line speed of 400 inches per minute (IPM) and a precursor supply flow rate of 400 standard liters per minute (SLPM), the upstream exhaust flow was calculated to be 860 SLPM and the downstream exhaust flow was calculated to be 300 SLPM. When the precursor supply flow rate was increased to 600 SLPM, the upstream exhaust flow was calculated to be 1260 SLPM while the downstream exhaust flow remained at 450 SLPM.

Increasing the line speed to 600 IPM with a precursor supply flow rate of 400 SLPM, the upstream exhaust flow was calculated to be 1360 SLPM and the downstream exhaust flow was calculated to be 260 SLPM. When the precursor supply flow rate was increased to 600 SLPM, the upstream exhaust flow was calculated to be 1980 SLPM while the downstream exhaust flow remained at 390 SLPM.

EXAMPLE

The relationship between the exhaust and precursor flows needed to balance flow in the reactions zones was calculated for a symmetrical dual flow CVD coater wherein the upstream and downstream toes had both been positioned ¼ inch above the glass surface but wherein, in accordance with the invention, a ¹⁄₁₆ inch shim was installed on the upstream exhaust toe. At a line speed of 400 IPM and a precursor supply flow rate of 400 SLPM, the upstream exhaust flow was calculated to be 460 SLPM and the downstream exhaust flow was calculated to be 300 SLPM. When the precursor supply flow rate was increased to 600 SLPM, the upstream exhaust flow was calculated to be 630 SLPM and the downstream exhaust flow was calculated to be 510 SLPM.

Increasing the line speed to 600 IPM with a precursor supply flow rate of 400 SLPM, the upstream exhaust flow was calculated to be 580 SLPM and the downstream exhaust flow was calculated to be 300 SLPM. When the precursor supply flow rate was increased to 600 SLPM, the upstream exhaust flow was calculated to be 780 SLPM while the downstream exhaust flow was calculated to be 510 SLPM.

In accordance with the provisions of the patent statutes, the present invention has been described in what is considered to represent its preferred embodiment. However, it should be noted that the invention can be practiced otherwise than as specifically illustrated and described without departing from its spirit and scope.

What is claimed is:

1. An apparatus for coating a surface of a sheet of glass by deposition of a coating material on the surface as the sheet is conveyed past the apparatus, comprising:

a supply line for supplying a gaseous precursor mixture;

a chamber having an inlet connected to said supply line and an outlet adapted to be positioned adjacent a surface of a sheet of glass to be coated;

an upstream exhaust tower including a passageway for exhausting unreacted portions of the gaseous precursor mixture and an upstream exhaust toe positioned a specific height above the glass surface, said upstream exhaust toe being disposed upstream of said passageway;

a downstream exhaust tower including a passageway for exhausting unreacted portions of the gaseous precursor mixture and a downstream exhaust toe downstream from said passageway in said downstream exhaust tower, said downstream exhaust toe being positioned a specific height above the glass surface which is greater than the height at which said upstream exhaust toe is positioned; and a first surface extending from the outlet of said chamber toward the upstream tower and a second surface extending from the outlet of said chamber toward the downstream tower, the first surface and the second surface being disposed substantially equal distances from the glass surface, and wherein the distance between the outlet of said chamber and the passageway in said upstream exhaust tower is approximately equal to the distance between the outlet of said chamber and the passageway in said downstream exhaust.

2. An apparatus as defined in claim 1, further comprising a shim disposed between said upstream exhaust tower and said upstream exhaust toe.

3. An apparatus as defined in claim 2, wherein said shim extends the length of said apparatus.

4. An apparatus as defined in claim 1, wherein said chamber further includes a plurality of baffles.

5. An apparatus as defined in claim 4, wherein said baffles are disposed to equalize the flow of said precursor mixture across said apparatus to assure that said material is discharged against the glass in a smooth, laminar, and uniform flow.

6. An apparatus as defined in claim 1, further including at least one heat exchange cavity disposed adjacent said chamber.

7. An apparatus as defined in claim 1, further including two heat exchange cavities, each one of said cavities are disposed to maintain said apparatus at a predetermined temperature.

8. An apparatus as defined in claim 1, wherein said apparatus may be incorporated into a float bath.

9. An apparatus as defined in claim 1, wherein said apparatus may be incorporated into a lehr.

10. An apparatus as defined in claim 1, wherein said apparatus may be incorporated into a transition zone between a float bath and a lehr.

11. An apparatus for coating a surface of a sheet of glass by deposition of a coating material on the surface as the sheet is conveyed past the apparatus, comprising:

a supply line for supplying a gaseous precursor mixture;

a chamber having an inlet connected to said supply line and an outlet adapted to be positioned adjacent a surface of a sheet of glass to be coated;

an upstream exhaust tower including a passageway for exhausting unreacted portions of the gaseous precursor mixture and an upstream exhaust toe positioned a specific height above the glass surface, said upstream exhaust toe being disposed upstream of said passageway;

a shim disposed between said upstream exhaust tower and said upstream exhaust toe;

a downstream exhaust tower including a passageway for exhausting unreacted portions of the gaseous precursor mixture and a downstream exhaust toe, said downstream exhaust toe being disposed downstream of said passageway in said downstream exhaust tower, said downstream exhaust toe being positioned a specific height above the glass surface which is greater than the height at which said upstream exhaust toe is positioned, and wherein the distance between the outlet of said chamber and the passageway in said upstream exhaust tower is approximately equal to the distance between the outlet of said chamber and the passageway in said downstream exhaust tower; and a first surface extending from the outlet of said chamber toward the upstream tower and a second surface extending from the outlet of said chamber toward the downstream tower, the first surface and the second surface being disposed substantially equal distances from the glass surface.

* * * * *